US008860288B2

(12) United States Patent
Chang et al.

(10) Patent No.: US 8,860,288 B2
(45) Date of Patent: Oct. 14, 2014

(54) MODULIZED LED APPARATUS WITH ENHANCED HEAT DISSIPATION

(75) Inventors: Li-Fen Chang, Taipei (TW); Wen-Kai Kuo, Yunlin County (TW)

(73) Assignee: Power Photon Co., Ltd., Taipei (TW)

( * ) Notice: Subject to any disclaimer, the term of this patent is extended or adjusted under 35 U.S.C. 154(b) by 760 days.

(21) Appl. No.: 13/019,555

(22) Filed: Feb. 2, 2011

(65) Prior Publication Data
US 2011/0193462 A1 Aug. 11, 2011

(30) Foreign Application Priority Data

Feb. 11, 2010 (TW) ................................ 99104368 A

(51) Int. Cl.
| | |
|---|---|
| H01J 7/24 | (2006.01) |
| F21V 29/00 | (2006.01) |
| F21V 3/04 | (2006.01) |
| H01L 31/00 | (2006.01) |
| F21V 3/02 | (2006.01) |
| F21K 99/00 | (2010.01) |
| F21V 7/22 | (2006.01) |
| F21V 3/00 | (2006.01) |
| F21Y 101/02 | (2006.01) |

(52) U.S. Cl.
CPC .............. *H01L 31/00* (2013.01); *F21V 29/006* (2013.01); *F21V 3/0418* (2013.01); *F21V 7/22* (2013.01); *F21V 3/005* (2013.01); *F21V 3/02* (2013.01); *F21Y 2101/02* (2013.01); *F21V 3/0472* (2013.01); *F21K 9/135* (2013.01)
USPC .......................................................... 313/46

(58) Field of Classification Search
CPC ........................................................ H01L 31/00
USPC .......................................................... 313/46
See application file for complete search history.

(56) References Cited

U.S. PATENT DOCUMENTS

2006/0001384 A1* 1/2006 Tain et al. ..................... 315/246
2006/0243426 A1* 11/2006 Hsu ........................ 165/104.26

* cited by examiner

*Primary Examiner* — Anh Mai
*Assistant Examiner* — Hana Featherly
(74) *Attorney, Agent, or Firm* — Muncy, Geissler, Olds & Lowe, P.C.

(57) ABSTRACT

A modulized LED apparatus includes a container having a chamber wall with a chamber therein, a transparent surface thereof for the container to be pervious to radiant energy and/or light. The container has an optical processing area for converging, collecting or diffusing radiant energy and/or light. A liquid refrigerant and an evaporator including a heat conductor unit and a capillary unit are in the chamber, and the capillary unit has a portion contacting the liquid refrigerant. With the heat generated by an operating LED device, the evaporator evaporates the liquid refrigerant into a gaseous phase, which then condenses on the chamber wall and thus transfers heat to the chamber wall for dissipating, and the condensed refrigerant is evaporated again by the evaporator again into the gaseous phase. Due to this thermal recycling, the refrigerant continuously transfers heat from the LED device to the ambient environment.

17 Claims, 20 Drawing Sheets

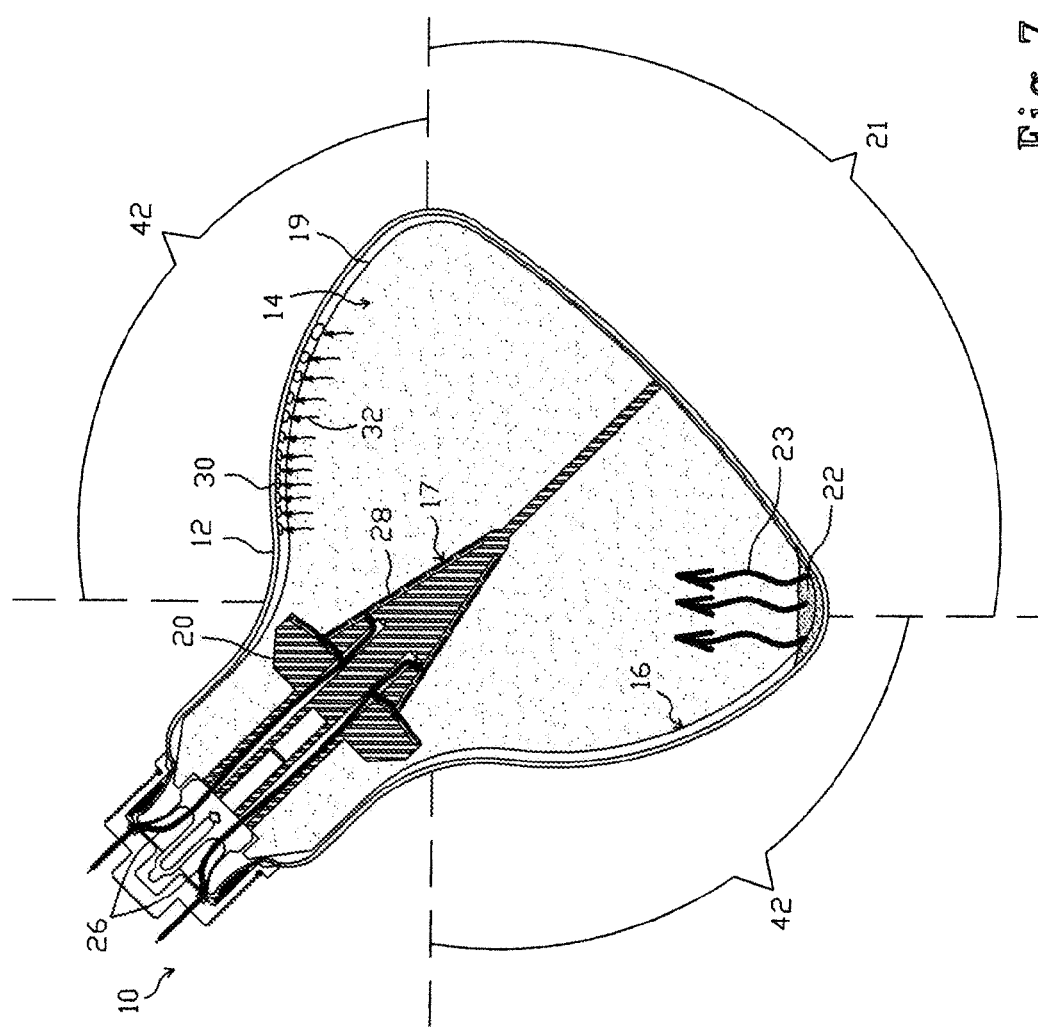

MODULIZED LED APPARATUS WITH ENHANCED HEAT DISSIPATION

FIELD OF THE INVENTION

The present invention is related to a structure for heat dissipation enhancement for a semiconductor device.

BACKGROUND OF THE INVENTION

When a semiconductor device works, it has to stay with a proper range of temperature to maintain good efficiency. For example, solar cells, light emitting diodes (LEDs) and thermoelectric semiconductor devices (e.g. thermoelectric generators) operating under high junction temperature will have reduced efficiency, or even color drift in the case of LEDs. For concentrating solar cells and high power LEDs, heat dissipation is particularly important. However, to such high power devices, a conventional metal fin heat sink is limited in capability of heat dissipation, and has high thermal resistance, while being bulky and heavy.

U.S. Pat. No. 4,211,581 immerses a light converter in a transparent liquid having a low boiling point, such that heat generated by the light converter will heat up the transparent liquid to vapor so as to remove the heat. However, air bubbles in the boiling liquid are likely to accumulate at the surface of the light converter and thus bar the liquid at the periphery from coming inside to contact the light converter. Consequently, the heat removal is hindered. Although the liquid also evaporates at the liquid surface, liquid convection has high thermal resistance, so the efficiency of its thermal transfer is poor, and therefore is weak in heat dissipation. In addition, the liquid surface of the transparent liquid adversely affects the light converter in terms of absorption for radiant energy and/or light.

U.S. Pat. No. 4,166,917 provides a concentrating solar receiver, in which a solar cell is such installed on support rings that pins connecting the support rings transfer the heat generated by the solar cell to an external heat pipe with a working fluid running therein to remove therefrom. Nevertheless, the heat pipe will significantly increase the volume and structural complexity of the solar receiver, being unfavorable to miniaturization of the apparatus.

U.S. Pat. No. 4,491,683 fills a chamber with gas so that when a cooling system disposed on the back side of a photoreceiver convects the gas in the chamber, heat generated by the photoreceiver is transferred to the chamber wall and in turn dissipated to the ambient environment. However, since gas convection has high thermal resistance, the efficiency of its thermal transfer is poor, and therefore is weak in heat dissipation.

SUMMARY OF THE INVENTION

An object of the present invention is to provide a structure that ensures a semiconductor device with good heat dissipation and provides an optical processing area to converge, collect or diffuse radiant energy and/or light for the active surface of the semiconductor device.

According to the present invention, a modulized semiconductor apparatus includes a container having a chamber containing a liquid refrigerant, an evaporator that includes a heat conductor unit and a capillary unit having a portion contacting the liquid refrigerant, and a semiconductor device that has an active surface and is thermally connected to the evaporator.

The capillary unit includes a thermally conductive capillary plate, a wick or a combination thereof.

The active surface of the semiconductor device includes a surface where the semiconductor device absorbs or radiates radiant energy and/or light.

The chamber wall has a transparent surface allowing the container to be pervious to radiant energy and/or light.

The container includes an optical processing area for converging, collecting or diffusing radiant energy and/or light.

The heat generated by the operating semiconductor device is transferred to the evaporator, the liquid refrigerant is thus heated and evaporated by the evaporator into a gaseous phase to fill in the chamber, and then condenses at the chamber wall and returns to the liquid phase, so that the heat is transferred to the chamber wall and then dissipated to the ambient environment. The condensed refrigerant is evaporated again by the evaporator into the gaseous phase. Due to this recycling, the refrigerant continuously dissipates the heat produced by the semiconductor device to the ambient environment.

Since the active surface of the semiconductor device is exposed outside the liquid refrigerant, it can absorb or radiate radiant energy and/or light without influence from the liquid surface of the liquid refrigerant.

The evaporator provides a relatively large surface for evaporation and thus evaporates the liquid refrigerant with higher efficiency, and in turn transfers the heat generated by the semiconductor device rapidly.

The container provides a relatively large space to accommodate the gaseous refrigerant, so as to significantly increase the amount of evaporation of the liquid refrigerant, and increase the surface area contacting the ambient environment, thereby enlarging the area for heat exchange and substantially accelerating heat dissipation.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 7 is a schematic diagram showing the modulized semiconductor apparatus of FIG. 1 with its transparent surface facing downward and including a 45° included angle with the horizontal;

DETAILED DESCRIPTION OF THE INVENTION

Figure 1:
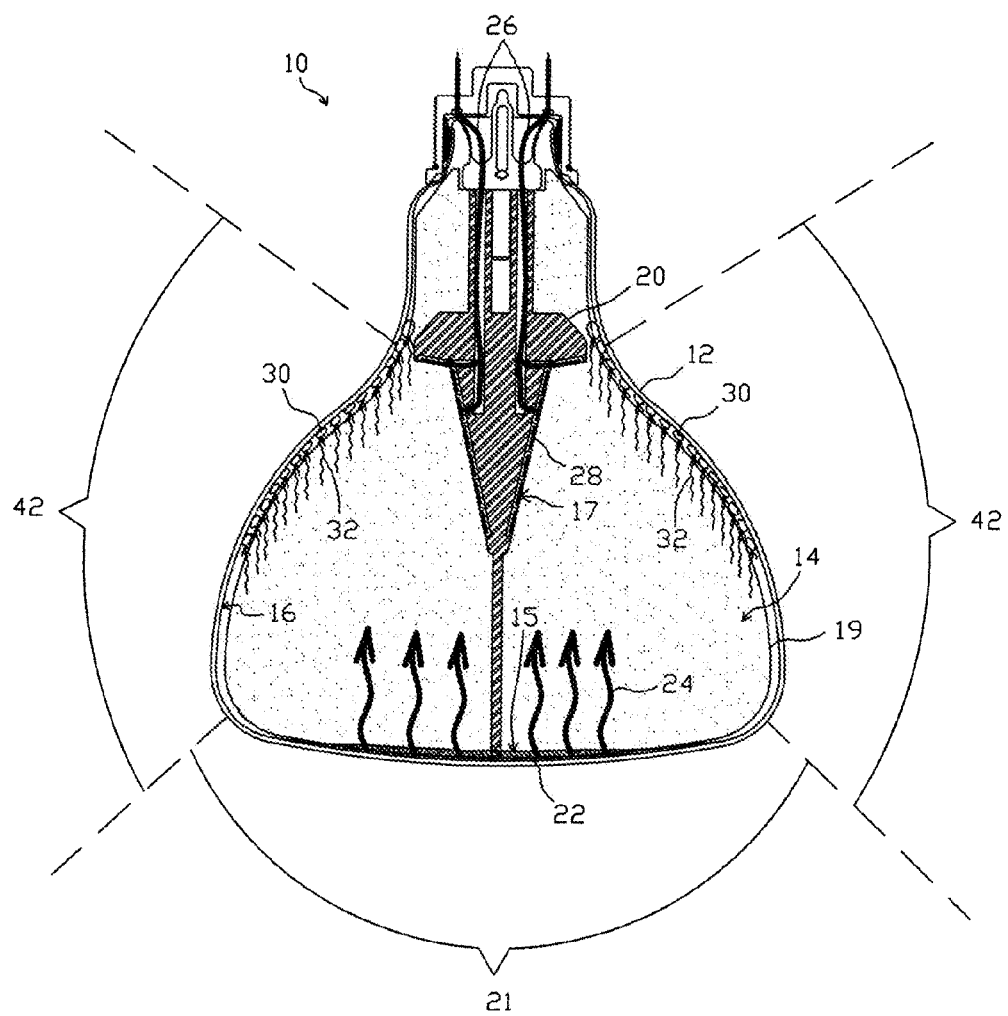
FIG. 1 is a schematic diagram showing a first embodiment of a modulized semiconductor apparatus according to the present invention.

FIG. 1 shows a first embodiment according to the present invention, in which a heat dissipation enhanced modulized semiconductor apparatus 10 includes a container 12 having an airtight chamber 14 therein, filled with a phase changeable refrigerant such that a liquid refrigerant 22 and a gaseous refrigerant 32 in the chamber 14 will maintain a dynamic balance therebetween. The liquid refrigerant 22 will aggregate at the bottom of the chamber 14 due to gravity, while the gaseous refrigerant 32 pervades the chamber 14. The chamber wall 16 is made of glass, metal or a combination thereof, and has a transparent surface 21 allowing radiant energy and/or light to come into or out from chamber 14. The container 12 has an optical processing area 42 for converging, collecting or diffusing radiant energy and/or light, an evaporator including a heat conductor unit 20 and thermally conductive capillary plates 19 is located in the chamber 14, several semiconductor devices 28 are deposited in the chamber 14 and thermally connected to the heat conductor unit 20, each of which has an active surface 17 for absorbing or radiating radiant energy and/or light, and electric wires 26 have one end electrically connected to the semiconductor devices 28 and an opposite end piercing through the container 12 for delivering or receiving electric power. The liquid refrigerant 22 is in an amount not submerging the semiconductor devices 28, such that the active surfaces 17 of the semiconductor devices 28 are exposed outside the liquid surface 15 of the liquid refrigerant 22. Each of the thermally conductive capillary plates 19 is thermally connected to the heat conductor unit 20 and has only a portion contacting the liquid refrigerant 22 for the liquid refrigerant 14 to be drawn by capillarity to move toward and distribute on the thermally conductive capillary plate 19, as indicated by arrows 24. In this thermal design, heat produced by the operating semiconductor devices 28 will be transferred to the heat conductor unit 20 and in turn heats the thermally conductive capillary plates 19, thereby making the liquid refrigerant 22 on the thermally conductive capillary plates 19 evaporate into the gaseous refrigerant 32. In an embodiment, the container 12 is a glass bulb with the transparent surface 21 downward and parallel to the horizontal plane. Since glass is a durable and reliable airtight packaging material, enjoys well developed processing technology, and is relatively inexpensive, it is favorable to economic mass production of the container 12.

Figure 2:
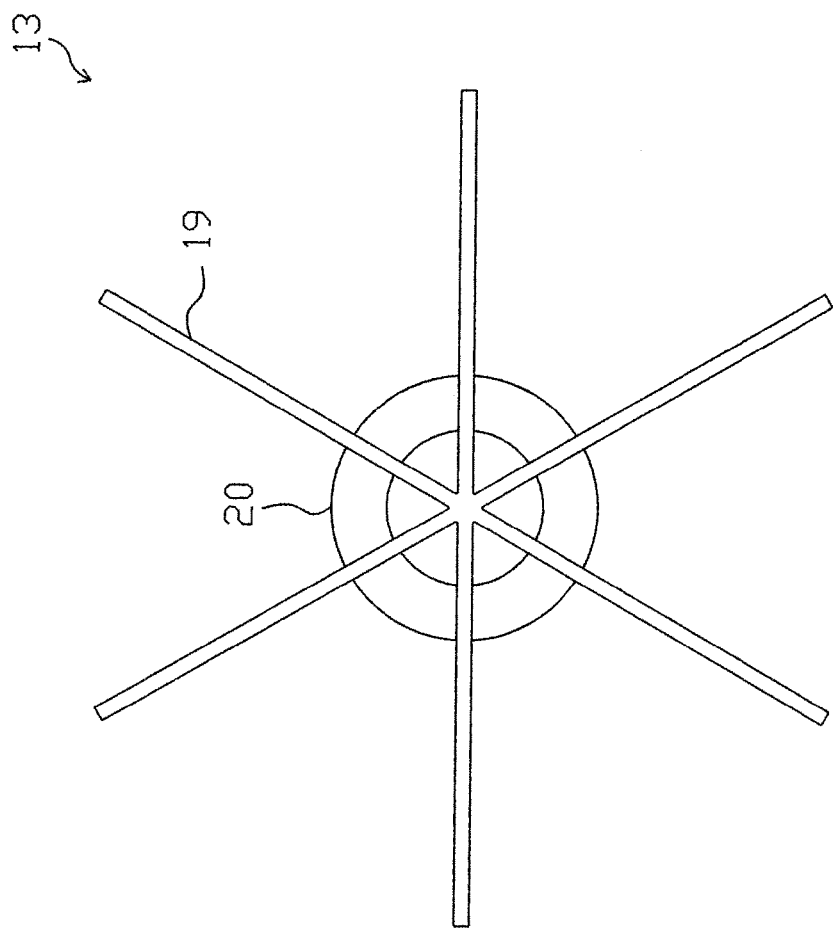
FIG. 2 is a top view of the evaporator shown in FIG. 1.
Figure 3:
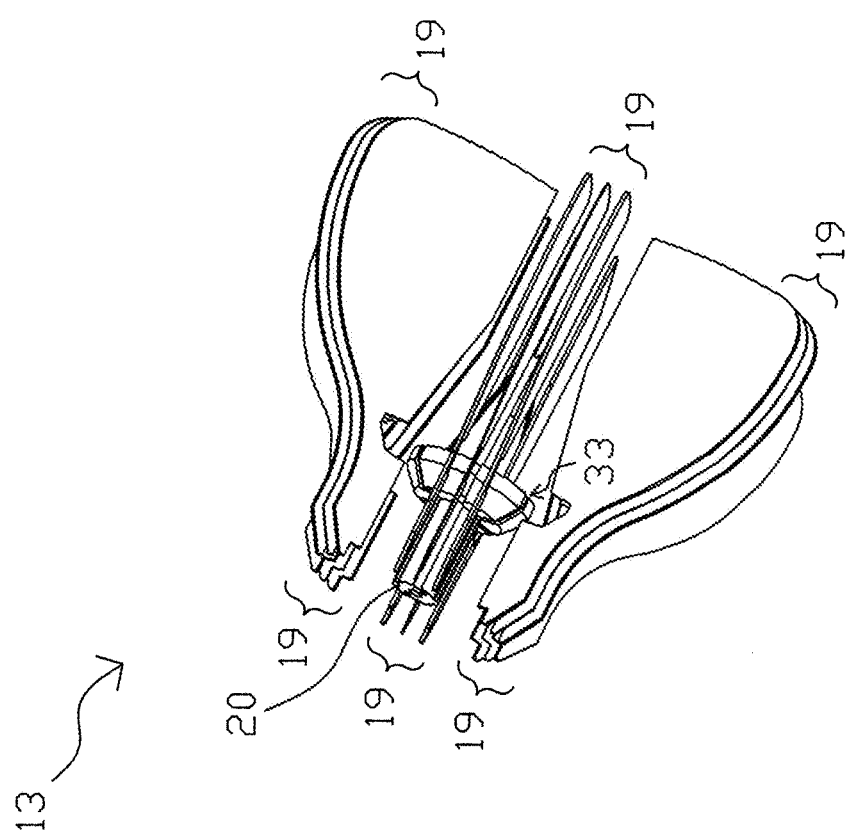
FIG. 3 is an exploded view of the evaporator shown in FIG. 2.
Figure 6:
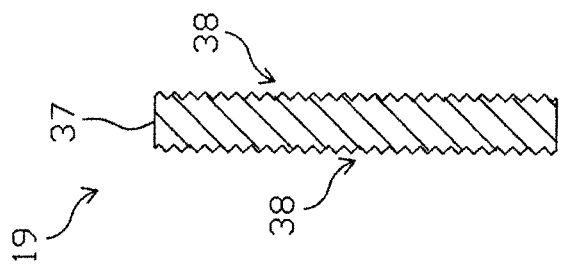
FIG. 6 is a cross-sectional view of a third embodiment for the thermally conductive capillary plate shown in FIG. 2.
Figure 5:
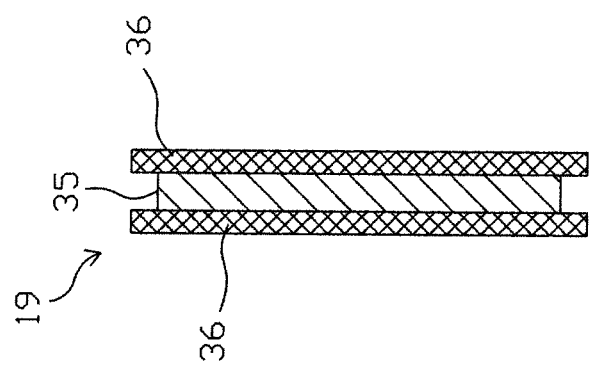
FIG. 5 is a cross-sectional view of a second embodiment for the thermally conductive capillary plate shown in FIG. 2.
Figure 4:
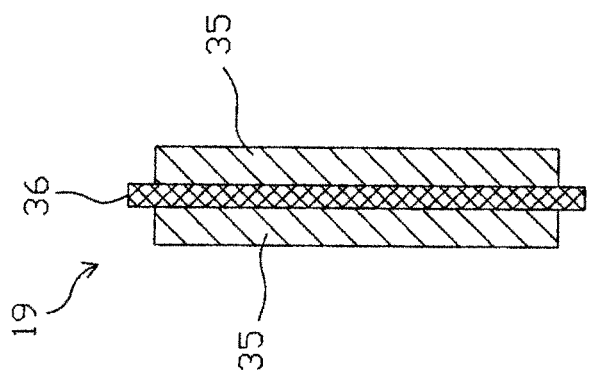
FIG. 4 is a cross-sectional view of a first embodiment for the thermally conductive capillary plate shown in FIG. 2.

FIGS. 2 and 3 are a top view and an exploded view of the evaporator in the modulized semiconductor apparatus 10 of FIG. 1, in which the evaporator 13 has the thermally conductive capillary plates 19 thermally connected to the heat conductor unit 20, for example, by inlaying the thermally conductive capillary plates 19 into grooves 33 formed on the heat conductor unit 20. FIGS. 4-6 provide cross-sectional views of three embodiments, respectively, for the thermally conductive capillary plate 19. Referring to FIGS. 1-6, the thermally conductive capillary plate 19 of FIG. 4 includes a sheet of capillary material 36 sandwiched between two sheets of thermally conductive material 35 that are thermally connected to the heat conductor unit 20, and contrarily, the thermally conductive capillary plate 19 of FIG. 5 includes two sheets of capillary material 36 sandwiching a sheet of thermally conductive material 35 therebetween that is thermally connected to the heat conductor unit 20. The thermally conductive material 35 includes metal or composite material, and the capillary material 36 may include a mesh article, powder or a fiber fabric, capable of being moistened by and conveying the liquid refrigerant 22 under capillarity. Preferably, the sheet of capillary material 36 is designed to have a periphery slightly jutting out of the sheet of thermally conductive material 35, so as to be close to the chamber wall 16 and allow ineffective liquid refrigerant 30, such as mist or dew condensed on the chamber wall 16 and failing to come back to the bottom of the chamber 14 to joint into the liquid refrigerant 22, to be drawn to the capillary material 36 under capillarity. In FIG. 6, the thermally conductive capillary plate 19 includes a thermally conductive plate 37 that has grooves, notches or rough surfaces 38 to support capillarity that attracts the liquid refrigerant 22 to come thereto. Heat produced by the operating semiconductor devices 28 is transferred to the thermally conductive material 35 or the thermally conductive plates 37 of the thermally conductive capillary plates 19 through the heat conductor unit 20, so that when the liquid refrigerant 22 in the capillary material 36 or on the surfaces 38 of the thermally conductive plates 37 evaporates into gaseous phase, the heat is taken away therefrom. The ineffective liquid refrigerant 30 condensed on the chamber wall 16 or the liquid refrigerant 22 gathered at the bottom of the chamber 14 is attracted by the thermally conductive capillary plates 19 and gets evaporated again. Since the evaporator 13 attracts the liquid refrigerant 22 on the strength of the thermally conductive capillary plates 19, the thermally conductive capillary plates 19 may be regarded as a capillary unit.

Referring to FIGS. 1-3, when the liquid refrigerant 22 attaching to the evaporator 13 is evaporated into gaseous phase, heat is removed. The gaseous refrigerant 32 with latent heat, when contacting the cool chamber wall 16, releases the latent heat and condenses into ineffective liquid refrigerant 30, so that the heat is transferred to the chamber wall 16. The ineffective liquid refrigerant 30 condensed on the chamber wall 16 is then directly attracted by the thermally conductive capillary plates 19 or returns to the bottom of the chamber 14 to become the liquid refrigerant 22 by gravity and attracted by the thermally conductive capillary plates 19 again to repeat the foregoing thermal cycle. Due to this phase change cycling of the refrigerant, heat generated by the operating semiconductor devices 28 will be continuously transferred to the chamber wall 16, and dissipated into the ambient environment from the outer surface of the container 12 under natural or forced convection. Since each thermally conductive capillary plate 19 extends between the heat conductor unit 20 and the chamber wall 16, the liquid refrigerant 22 has a large surface for evaporation. The chamber 14 may have its shape and size designed depending on demands. For greater power to be dissipated, the chamber 14 may be larger to have greater surface for evaporation. In addition, the larger the chamber 14 is, the greater the surface of its chamber wall 16 is and the greater surface of the chamber wall 16 meaning the container 12 has greater outer surface exposed to the ambient environment for heat exchange, thereby speeding up dissipation of the heat produced by the operating semiconductor devices 28.

Since the phase changeable refrigerant has its evaporation and condensation happening at temperatures almost identical, latent heat can be greatly absorbed and released within a quite minor temperature difference, having a very low thermal resistance. Therefore, while there is a dynamic balance between the liquid and gaseous refrigerants in the chamber 14, the temperature difference is small. The modulized semiconductor apparatus 10 has an effective thermal conductivity of about 2,000-10,000 W/(m×K), meaning that the conductive power is 2,000-10,000 Watts in a thickness of one meter, an area of one square meter and a temperature difference of one absolute degree, which is much higher than metal such as aluminum, copper, gold and silver.

The phase changeable refrigerant may include water, methanol, ethanol, acetone, aqua ammonia, chlorofluorocarbons (CFCs) or a mixture of two or more thereof. The heat conductor unit 20 may include a heat pipe or a vapor chamber made of metal or composite material. The semiconductor device 28 may be a photoelectronic semiconductor device, e.g. a solar cell or an LED, or a thermoelectric semiconductor device, e.g. a thermoelectric generator. A shield may be additionally provided for covering and shielding the semiconductor device 28 from the liquid or gaseous refrigerant. For example, by watertight packaging the semiconductor device 28 through infusion of packaging of epoxy resin or silica gel, durable and reliable protection to the semiconductor device 28 can be achieved to allow it to work normally in the chamber 14 where a dynamic balance between the liquid and gaseous refrigerants exists.

In the process of filling the phase changeable refrigerant into the chamber 14, air is first removed from the chamber 14, and then the phase changeable refrigerant is filled in an amount greater than or equal to a sum of an amount of the ineffective liquid refrigerant 30, a maximum amount of the liquid refrigerant that may be absorbed by the thermally conductive capillary plates 19, the minimum level of the liquid refrigerant sufficient to moisten the thermally conductive capillary plates 19, and a saturation amount of the gaseous refrigerant in the chamber 14, so as to maintain provision of the liquid refrigerant 22 to the thermally conductive capillary plates 19 and the heat conductor unit 20, thereby ensuring heat transfer of high efficiency and low thermal resistance through continuous evaporation and condensation.

With consideration of the relationship between the vapor accommodating space and the maximum heat transfer rate, when the chamber 14 provides a greater vapor accommodating space, the higher heat transfer rate can be achieved. Therefore, when the phase changeable refrigerant reaches a dynamic balance between its liquid phase and gaseous phase in the chamber 14, the sum of the amount of the ineffective liquid refrigerant 30 and the amount of the liquid refrigerant 22 converged at the bottom of the chamber 14 is designed not greater than half of the capacity of the chamber 14. Since liquid evaporation happens at the interface between the liquid refrigerant and the gaseous refrigerant, and evaporation performs continuously as long as the temperature is higher than absolute zero, i.e. −273.16° C., the system is such designed that the liquid surface 15 of the liquid refrigerant 22 converged at the bottom of the chamber 14 does not completely submerge the evaporator including the heat conductor unit 20 and the thermally conductive capillary plates 19, so as to allow the evaporator to continuously conduct evaporation at its surface.

Figure 8:
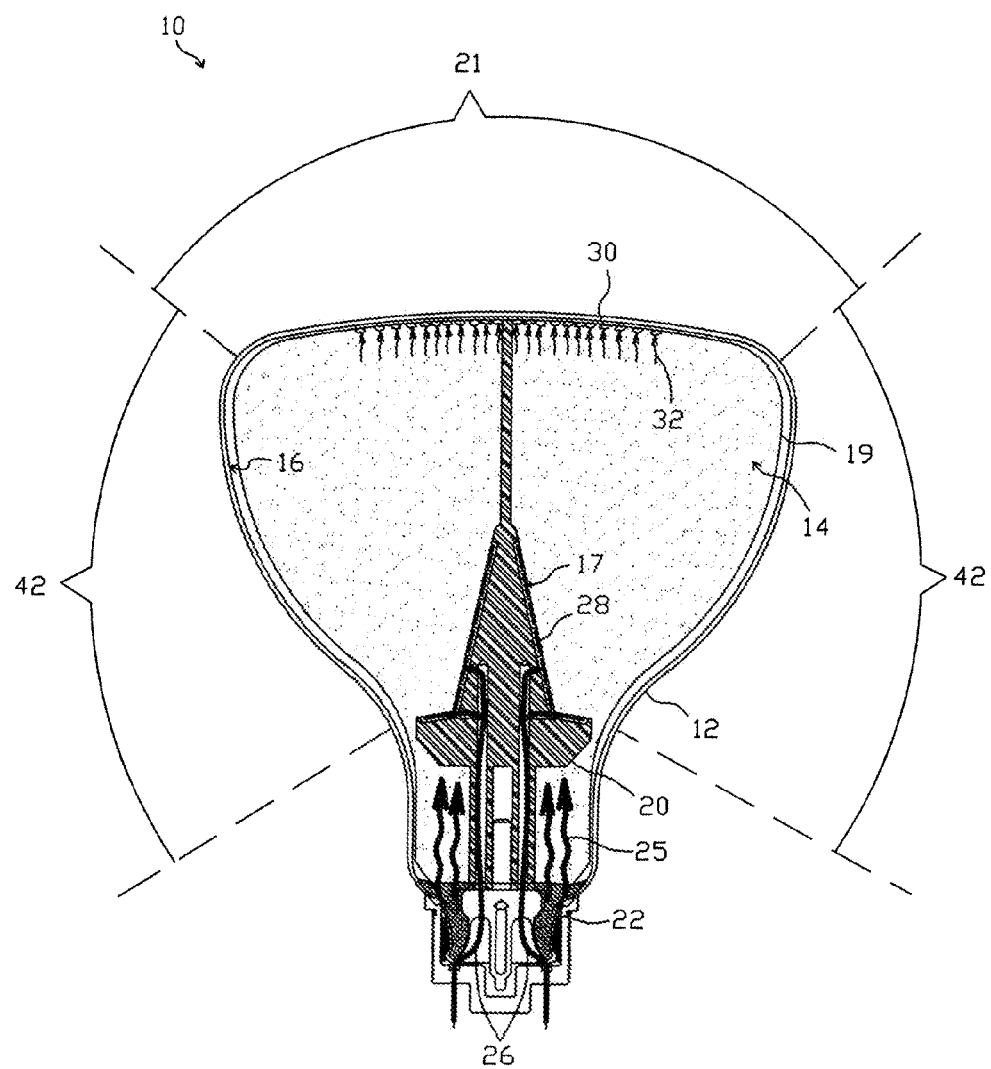
FIG. 8 is a schematic diagram showing the modulized semiconductor apparatus of FIG. 1 with its transparent facing upward and being parallel to the horizontal.

FIG. 7 is a schematic diagram showing the modulized semiconductor apparatus 10 such posed that the transparent surface 21 facing downward and includes a 45° included angle with the horizontal, and FIG. 8 is a schematic drawing showing the modulized semiconductor apparatus 10 such posed that the transparent surface 21 faces upward and is parallel with the horizontal. In any case, the liquid refrigerant 22 will flow downward under the gravity. Since the thermally conductive capillary plates 19 are close to the chamber wall 16 in any direction, no matter what the included angle between the modulized semiconductor apparatus 10 and the horizontal is, the liquid refrigerant 22 can be attracted to the thermally conductive capillary plates 19, as indicated by arrows 23 and 25 shown in FIGS. 7 and 8, thereby allowing the modulized semiconductor apparatus 10 to be usable at any tilting position.

Figure 9:
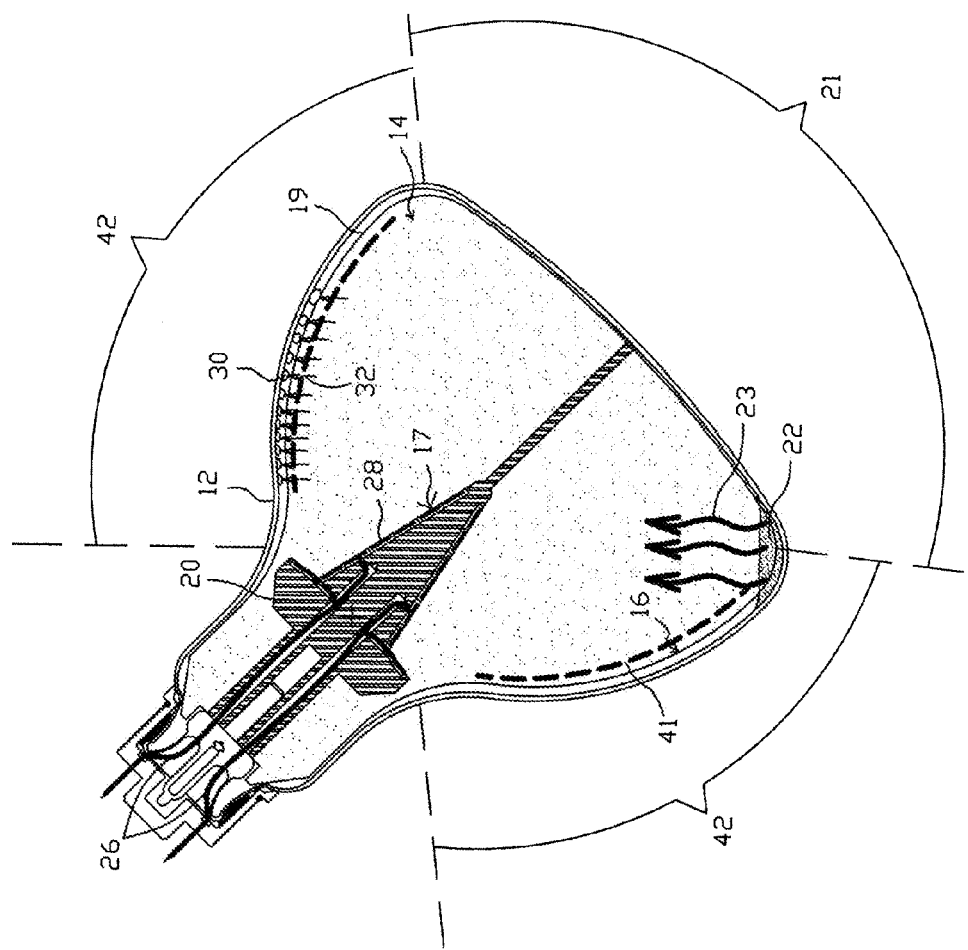
FIG. 9 is a schematic diagram illustrating the transparent surface and an optical processing area.

As shown in FIG. 9, the optical processing area 42 occupies a part of the chamber wall 16, which has an optical processing unit 41, such as an optically reflective layer provided at the inner or outer surface of the chamber wall 16 for converging and collecting radiant energy and/or light. If the semiconductor device 28 is a solar cell or a thermoelectric semiconductor device (e.g. thermoelectric generator), radiant energy and/or light entering the container 12 through the transparent surface 21 is reflected by the optical processing unit 41 and converged and collected at the active surface 17 of the semiconductor device 28 for power generation. The optical processing unit 41 helps the active surface 17 to receive radiant energy and/or light better. If the semiconductor device 28 is an LED, the light it emits is reflected by the optical processing unit 41 to be converged and collected before casted through the transparent surface 21 for illumination.

In another embodiment, the container 12 is made of glass and the optical processing unit 41 includes a semitranslucent coating provided on the inner or outer surface of the chamber wall 16 for diffusing radiant energy and/or light. If the semiconductor device 28 is an LED, the light it emits is diffused by the optical processing unit 41 and goes out through the chamber 14 for diffused illumination. In this case, the chamber wall 16 has its inner or outer surface coated with the semitranslucent coating at a region that will reflect light to the transparent surface 21. The light emits by the LED 28 is diffused by the optical processing unit 41 and the transparent surface 21 before coming out from the chamber 14. Alternatively, the inner or outer surface of the chamber wall 16 facing the optical processing area 42 and the transparent surface 21 may be processed through hydrofluoric acid erosion or sandblasting, so as to make the region on the chamber wall 16 become a semitranslucent, rough surface for diffusing the light emitted by the LED 28.

Figure 10:
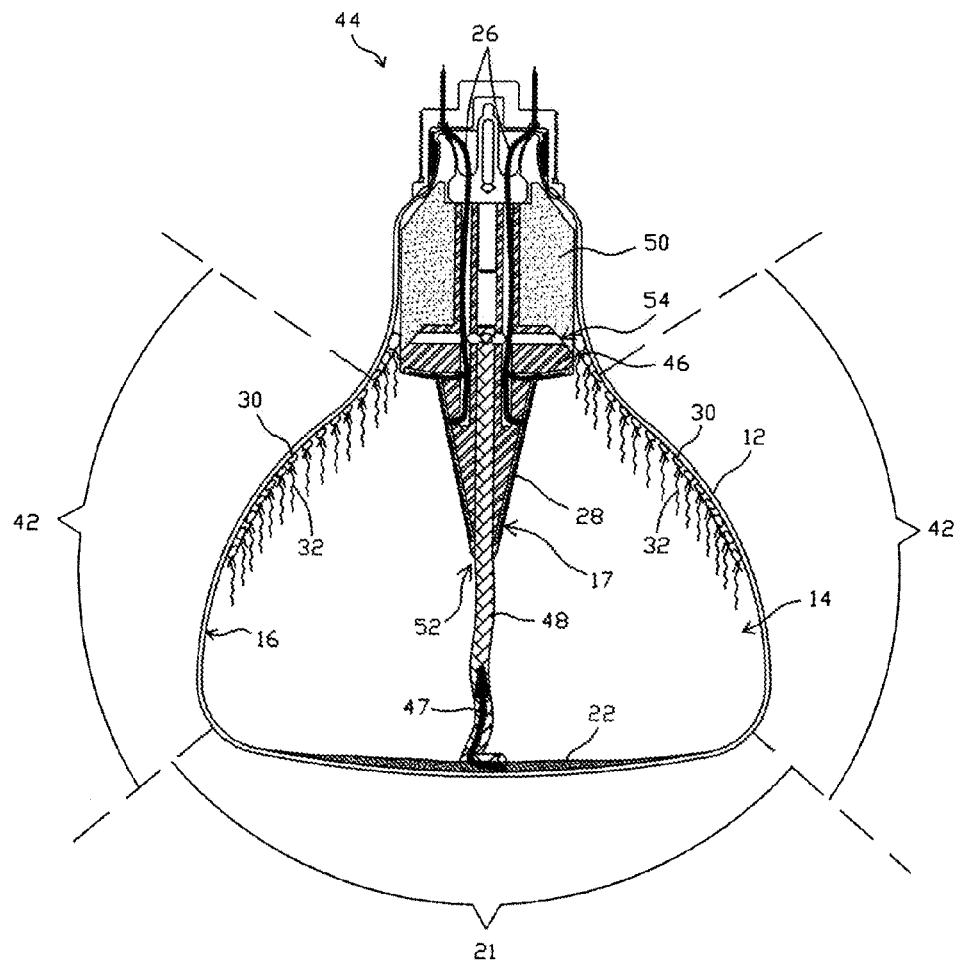
FIG. 10 is a schematic diagram showing a second embodiment of a modulized semiconductor apparatus according to the present invention.
Figure 11:
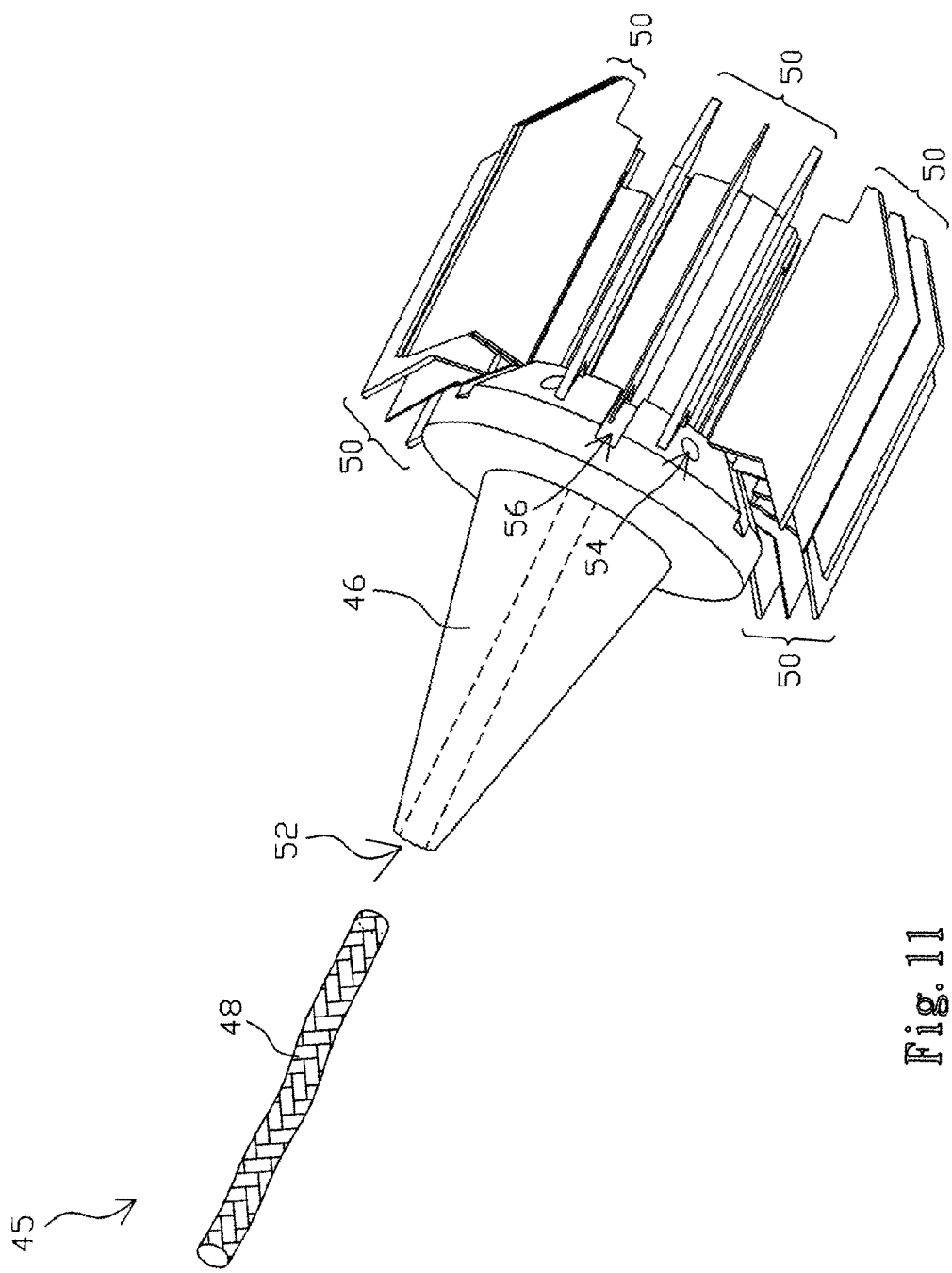
FIG. 11 is an exploded view of the evaporator shown in FIG. 10.

FIG. 10 shows a second embodiment according to the present invention, in which a modulized semiconductor apparatus 44 has a bulb-like container 12, and the transparent surface 21 faces downward while being parallel to the horizontal. The modulized semiconductor apparatus 44 includes an evaporation device 45 (referring to FIG. 11) composed of a heat conductor unit 46, thermally conductive capillary plates 50 and a wick 48 and located in the chamber 14. The thermally conductive capillary plates 50 and the wick 48 establish a capillary unit to attract the liquid refrigerant 22 and the ineffective liquid refrigerant 30. As shown in FIG. 11, the heat conductor unit 46 has an opening 52, a plurality of through holes 54 for communicating the opening 52 with the grooves 56. Referring to FIGS. 10 and 11, the wick 48 has one end inserted into the opening 52 and thereby thermally connected to the heat conductor unit 46, and an opposite end falling downward naturally under gravity to contact the liquid refrigerant 22 at the bottom of the chamber 14, so as to convey the liquid refrigerant 14 under capillarity, as indicated by arrow 47. The thermally conductive capillary plates 50 are thermally connected to the heat conductor unit 46 through the grooves 56. The structure of the thermally conductive capillary plate 50 are the same as that of FIG. 4, 5 or 6, to be thermally conductive and capable of being moistened by and conveying the liquid refrigerant 14 and the ineffective liquid refrigerant 30 under capillarity. Semiconductor devices 28 are installed on and thermally connected to the heat conductor unit 46 with their active surfaces 17 not submerged by the liquid surface of the liquid refrigerant 22. Electric wire 26 have one end electrically connected to the semiconductor devices 28 and an opposite end piercing through the container 12 for delivering or receiving electric power. Heat generated by the operating semiconductor devices 28 is transferred through the heat conductor unit 46 to the wick 48 at where it contacts and the thermally conductive capillary plates 50. The liquid refrigerant 22 contacting the wick 48 and the heat conductor unit 46 is heated by the heat conductor unit 46 and is evaporated into the gaseous refrigerant 32 that then runs out from the through holes 54 and thereby removes the heat. The gaseous refrigerant 32 contacts the chamber wall 16 and releases latent heat to condense into the ineffective liquid refrigerant 30, thereby transferring the heat to the chamber wall 16. The ineffective liquid refrigerant 30 condensed on the chamber wall 16 is partially attracted by the thermally conductive capillary plates 50 and evaporated, and partially drawn back to the bottom of the chamber 14 under gravity to become the liquid refrigerant 22, which is later attracted by the wick 48 to repeat the foregoing thermal cycling, so that the heat generated by the operating semiconductor device 28 can be continuously transferred to the chamber wall 16 and dissipated to the ambient environment through natural or forced convection. In one embodiment, the wick is made of a transparent material, such as glass or ceramics fiber fabric, so as not to shadow the active surfaces 17 of the semiconductor devices 28.

Figure 12:
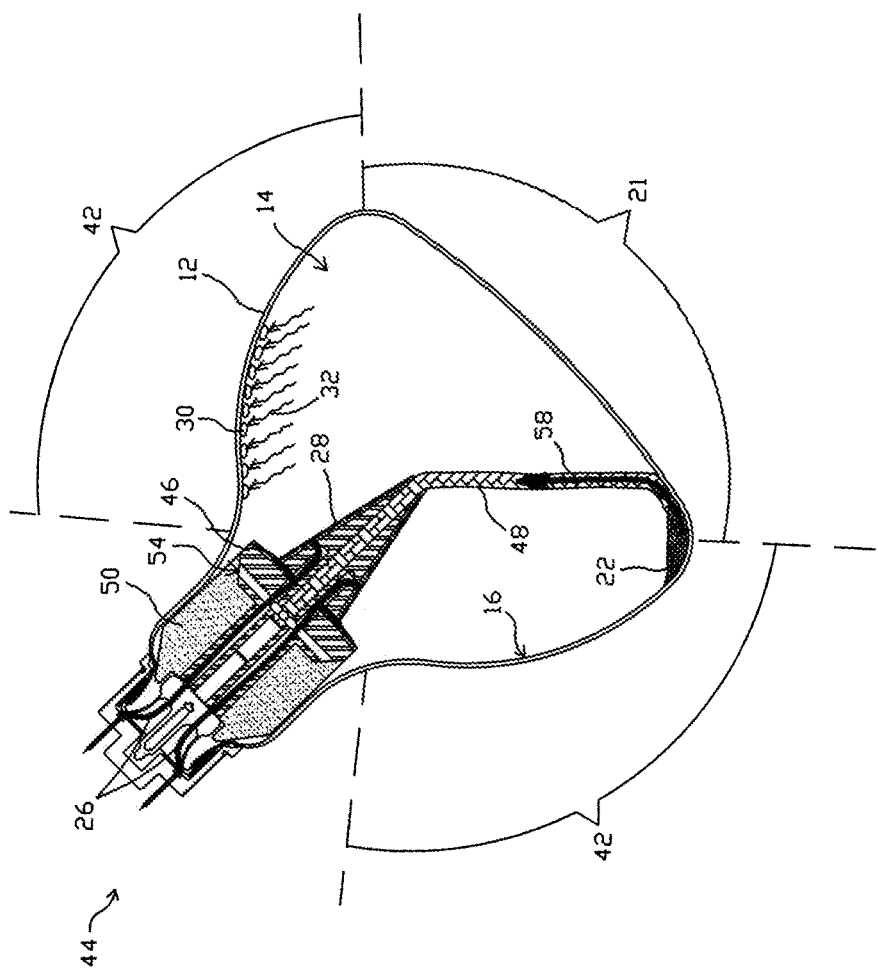
FIG. 12 is a schematic diagram showing the modulized semiconductor apparatus of FIG. 10 with its transparent surface facing downward and including a 45° included angle with the horizontal.
Figure 13:
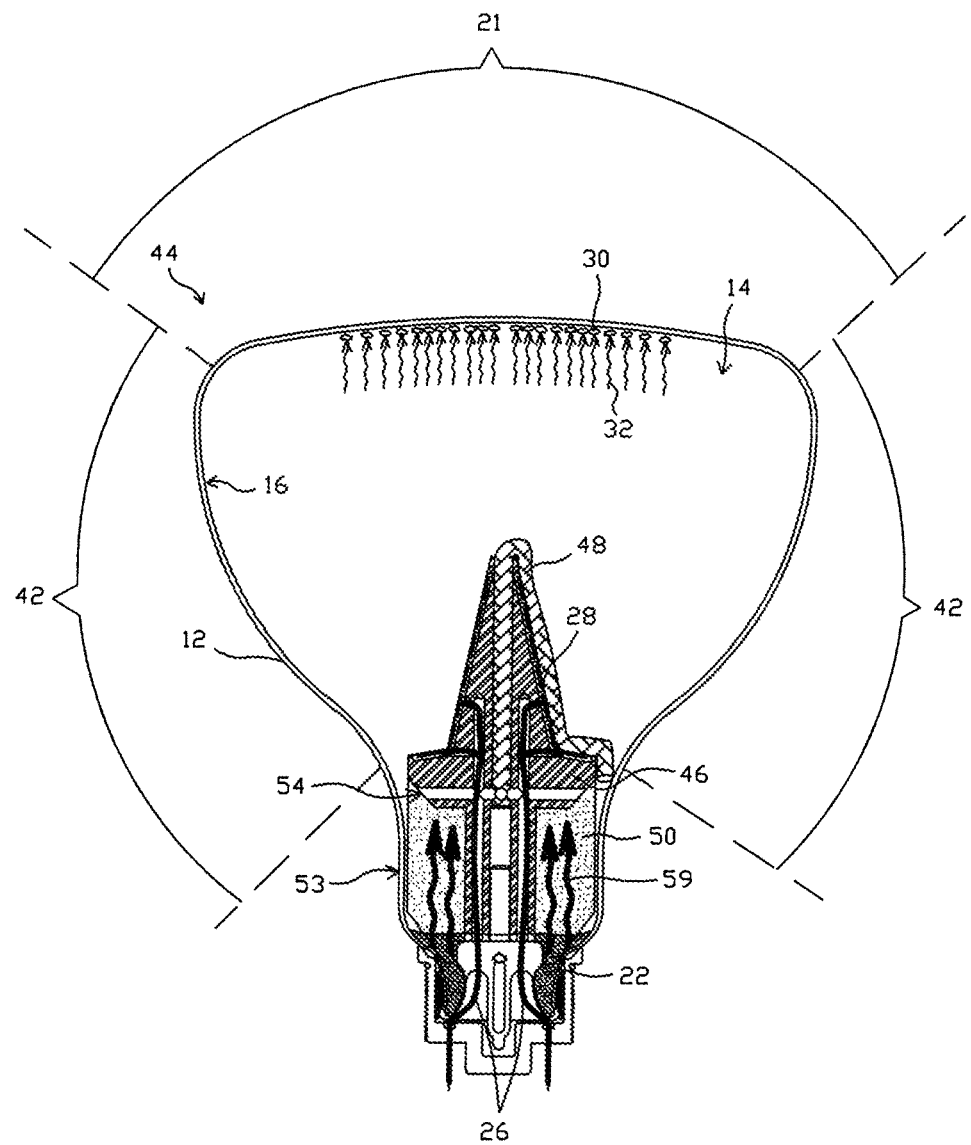
FIG. 13 is a schematic diagram showing the modulized semiconductor apparatus of FIG. 10 with its transparent facing upward and being parallel to the horizontal.

As shown in FIG. 12, when the transparent surface 21 of the modulized semiconductor apparatus 44 faces downward and includes a 45° included angle with the horizontal, the container 12 is tilted, and the terminal of the wick 48 falls down to the bottom of the chamber 14 to contact the liquid refrigerant 22 and draw the liquid refrigerant 22 to the wick 48, as indicated by arrow 58, so heat dissipation of the modulized semiconductor apparatus 44 is maintained good. As shown in FIG. 13, when the transparent surface 21 of the modulized semiconductor apparatus 44 faces upward and is parallel to the horizontal, the container 12 is tiled at an angle exceeding a certain threshold, and the liquid refrigerant 22 is gathered at the neck 53 of the container 12 due to gravity and attracted by the thermally conductive capillary plates 50, as indicated by arrows 59, heat generated by the semiconductor devices 28 is transferred to the thermally conductive capillary plates 50 through the heat conductor unit 46, so that the liquid refrigerant 22 on the thermally conductive capillary plates 50 is evaporated and removed, so heat dissipation of the modulized semiconductor apparatus 44 is still maintained good. This configuration of the wick 48 and the thermally conductive capillary plates 50 ensures the modulized semiconductor apparatus 44 to be usable at any tilting angle.

Figure 14:
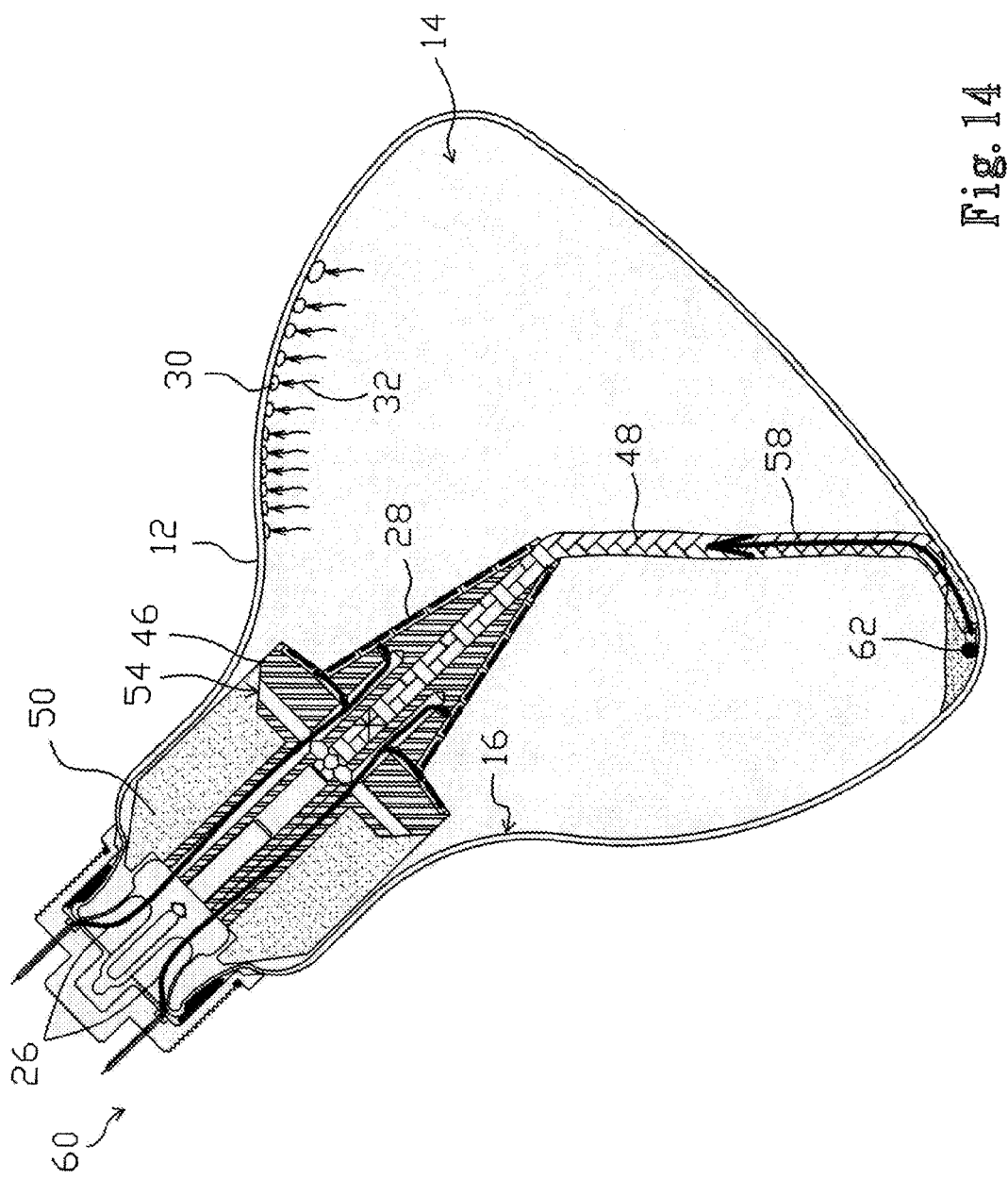
FIG. 14 is a schematic diagram depicting a wick being tailed with a weight.

In FIG. 14, a modulized semiconductor apparatus 60 is similar to that of FIG. 10 but is further equipped with a weight 62 affixed to the terminal of the wick 48, so as to ensure that the wick 48 remains contacting the liquid refrigerant 22 at the bottom of the chamber 14 despite how the container 12 is posed.

Figure 15:
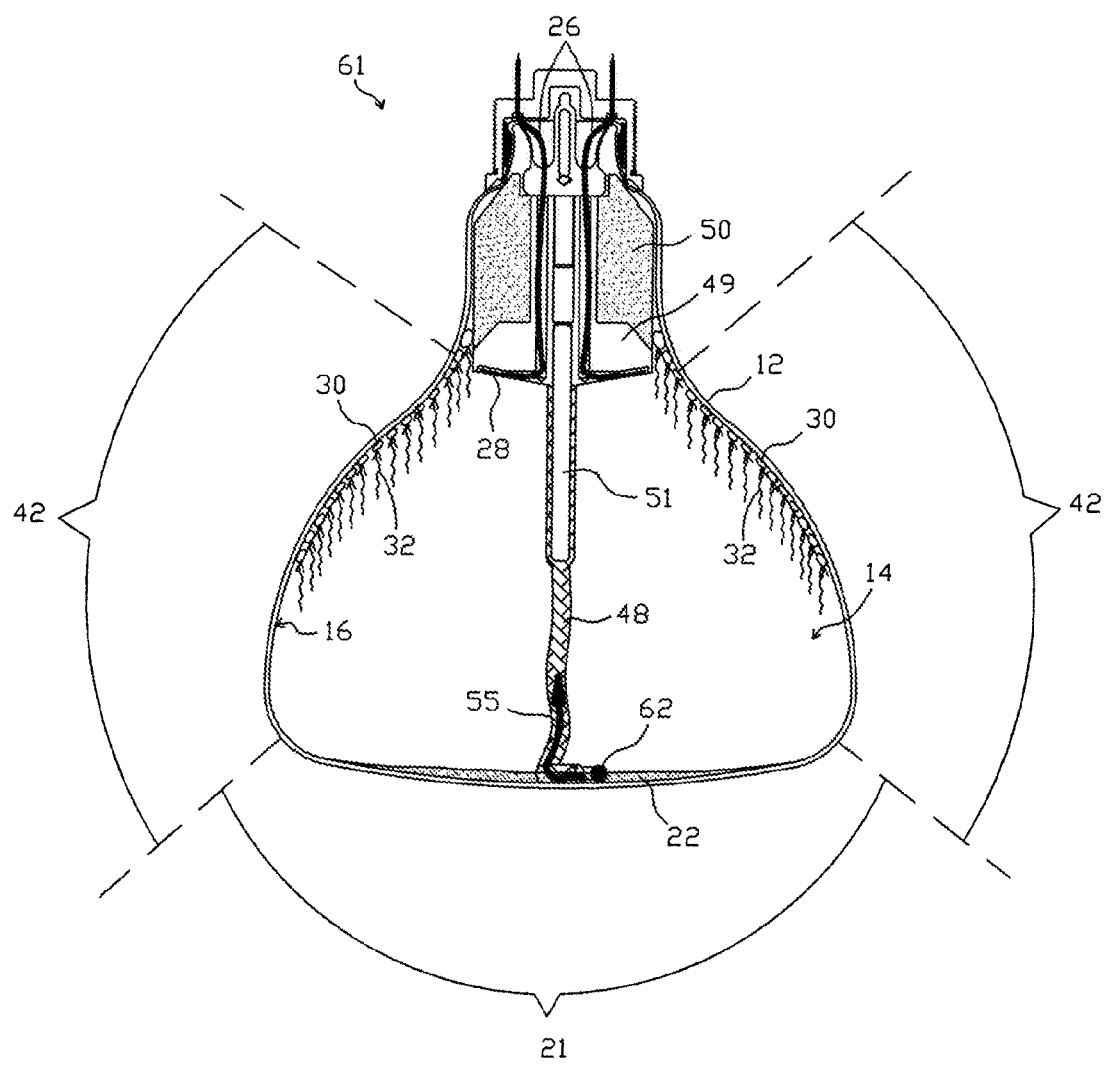
FIG. 15 is a schematic diagram showing a third embodiment of a modulized semiconductor apparatus according to the present invention.

FIG. 15 shows a fourth embodiment according to the present invention. In a modulized semiconductor apparatus 61, an evaporator includes a heat conductor unit 49 and a wick 48, the heat conductor unit 49 has an extension 51, and the wick 48 has one end covering the extension 51 to be thermally connected to the heat conductor unit 49, and an opposite end tailed with a weight 62 so as to keep contacting the liquid refrigerant 22 gathered at the bottom of the chamber 14 and thereby attracting the liquid refrigerant 22 upward under capillarity, as indicated by arrow 55. The extension 51 may include a heat pipe or a vapor chamber made of metal or composite materials.

The container 12 and evaporator may be designed in shape depending on demands. For example, in the embodiment of FIG. 16, a modulized semiconductor apparatus 64 includes a tubular container 57 having an optical processing area 42, the chamber wall 16 has a transparent surface 21, an evaporator inside the chamber 14 includes a heat conductor unit 66, a wick 48 and thermally conductive capillary plates 68. The wick 48 and the thermally conductive capillary plates 68 establish a capillary unit to attract the liquid refrigerant 22 and the ineffective liquid refrigerant 30 (referring to FIG. 18). The heat conductor unit 66 has a through hole 69 and a plurality of through holes 73 communicated with the through hole 69. The wick 48 is received in the through hole 69 so as to be thermally connected to the heat conductor unit 66, and has its two ends falling down to contact the liquid refrigerant 22, so that part of the liquid refrigerant 22 can be attracted by the wick 48 and conveyed to the through hole 69 under capillarity. The chamber 14 is divided into several regions 71 by the thermally conductive capillary plates 68, whose structure is the same as that of FIG. 4, 5 or 6, to be thermally conductive and capable of being moistened by and conveying the liquid refrigerant 22 under capillarity. Heat generated by the operating semiconductor devices 28 is transferred by the heat conductor unit 66 to heat the wick 48 at the portion it contacts and to heat the thermally conductive capillary plates 68. As a result, the liquid refrigerant 22 on the wick 48 absorbs the heat and is evaporated into the gaseous refrigerant 32 that then goes out from the through holes 73 and thereby removes the heat. The gaseous refrigerant 32, when contacting the chamber wall 16, releases latent heat to the chamber wall 16 and gets condensed into the ineffective liquid refrigerant 30 (referring to FIG. 18), so as to transfer the heat to the chamber wall 16. The ineffective liquid refrigerant 30 (referring to FIG. 18) condensed on the chamber wall 16 is partially attracted by the thermally conductive capillary plates 68 and evaporated, and partially drawn back to the bottom of the chamber 14 under gravity to become the liquid refrigerant 22, which is later attracted by the wick 48 to repeat the foregoing thermal cycling, so that heat generated by the operating semiconductor devices 28 can be continuously transferred to the chamber wall 16 and dissipated to the ambient environment through natural or forced convection.

Figure 16:
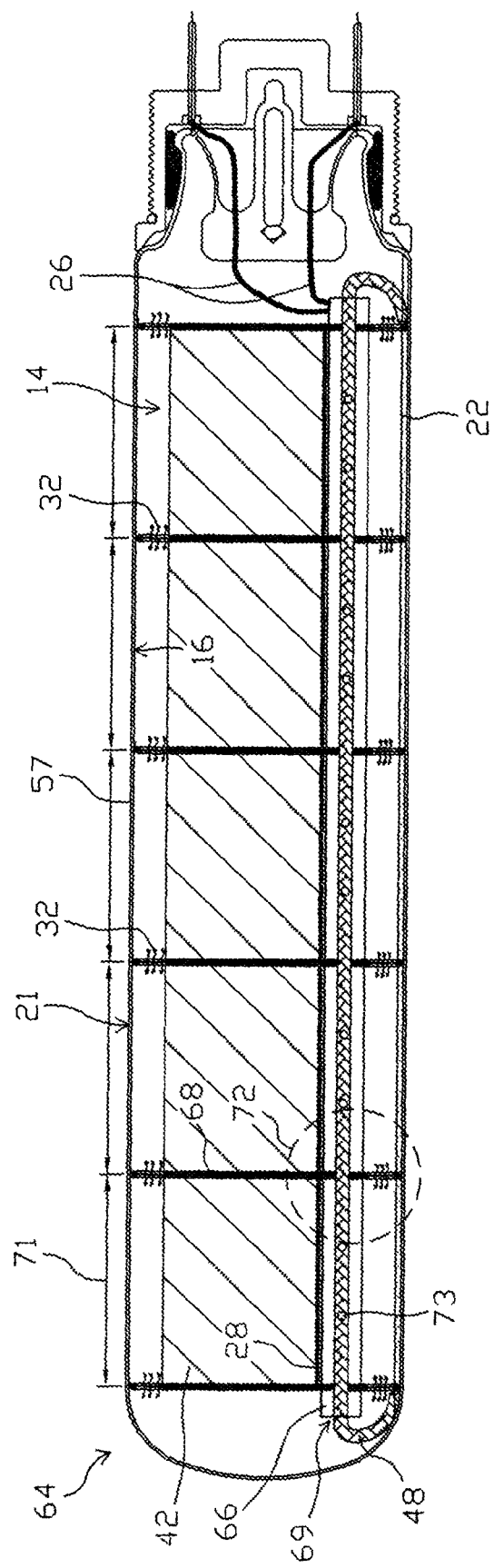
FIG. 16 is a schematic diagram showing a fourth embodiment of a modulized semiconductor apparatus according to the present invention.
Figure 18:
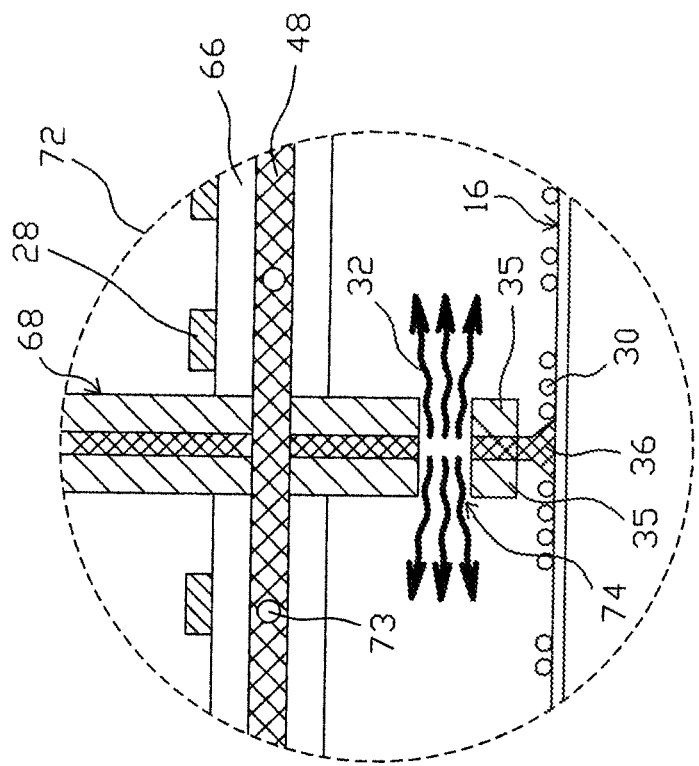
FIG. 18 is a partially enlarged view of FIG. 16.
Figure 17:
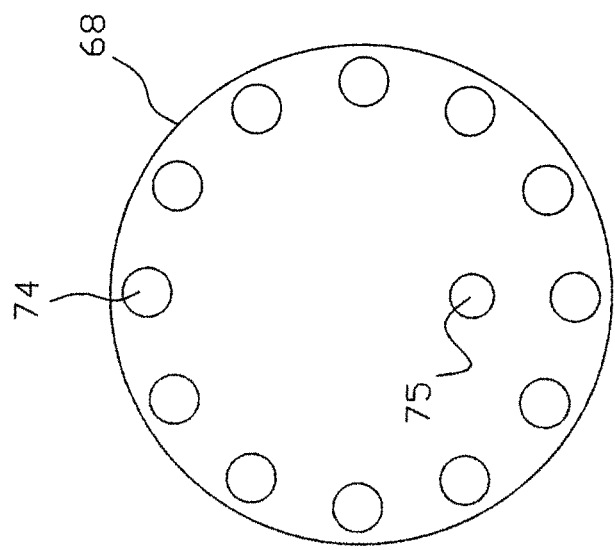
FIG. 17 is a schematic diagram of the thermally conductive capillary plate shown in FIG. 16.

FIG. 17 is a side view of the thermally conductive capillary plate 68 and FIG. 18 is an enlarged view of a local region 72 of FIG. 16. Referring to FIGS. 16, 17 and 18, each thermally conductive capillary plate 68 has a through hole 75 for receiving the wick 48 and a plurality of through holes 74 allowing the gaseous refrigerant 32 to flow among different said regions 71 so as to maintain dynamic balance between liquid phase and gaseous phase of the phase changeable refrigerant in the chamber 14. The capillary material 36 or the thermally conductive plate 37 in the thermally conductive capillary plates 68 is in contact with the wick 48, so the liquid refrigerant 22 is also conveyed by the wick 48 to the thermally conductive capillary plates 68 to be evaporated.

Figure 19:
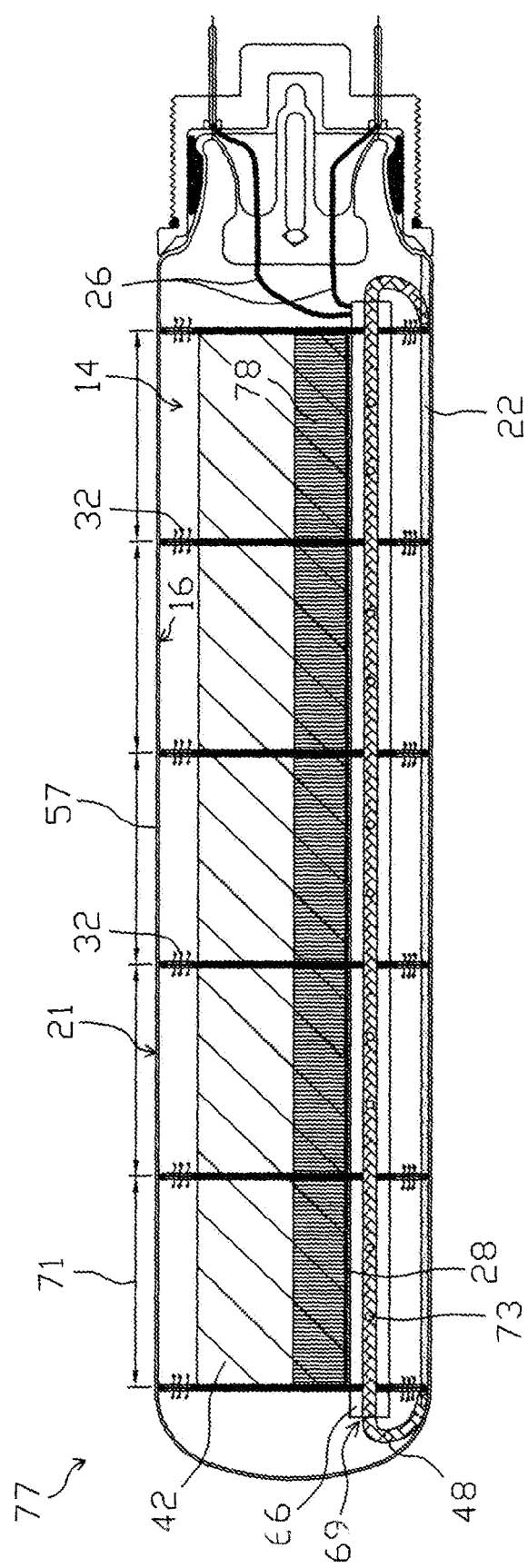
FIG. 19 is a schematic diagram showing a fifth embodiment of a modulized semiconductor apparatus according to the present invention.
Figure 20:
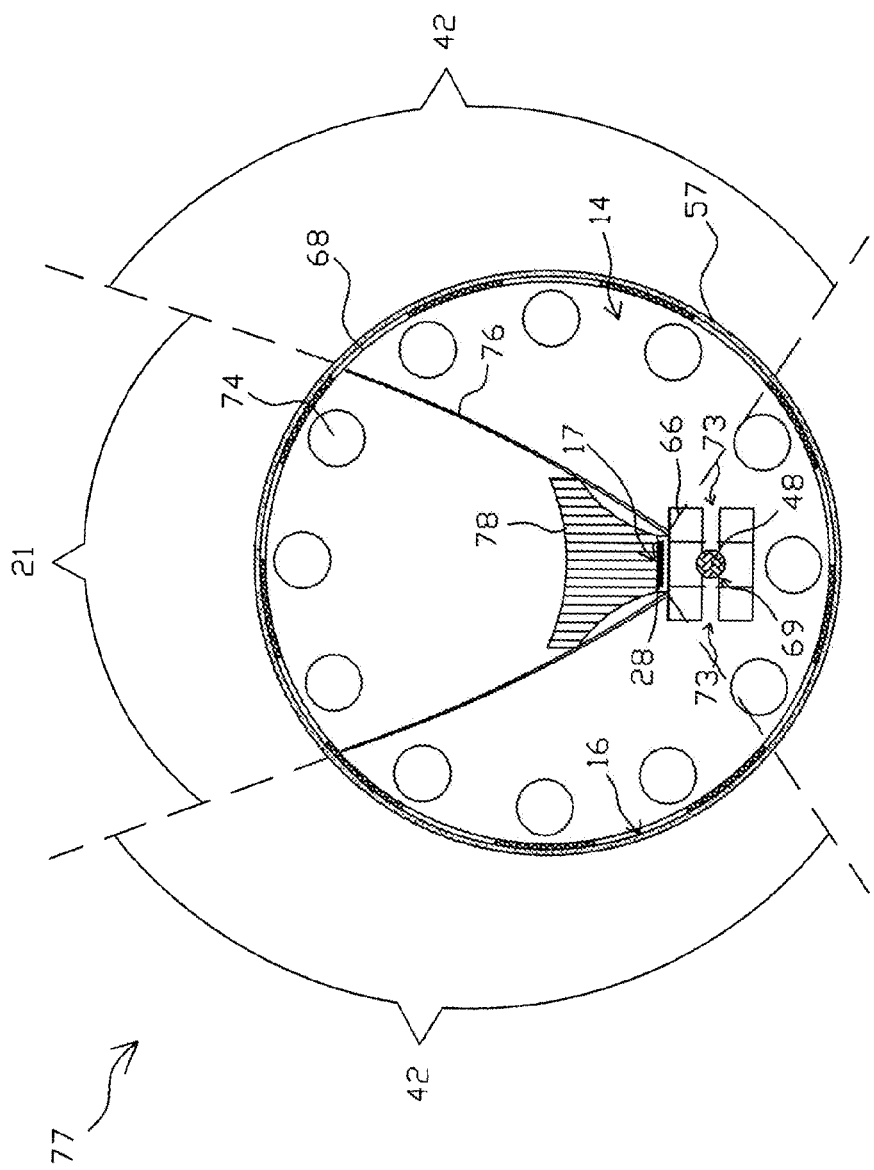
FIG. 20 is a side view of the modulized semiconductor apparatus shown in FIG. 19.

The modulized semiconductor apparatus 77 of FIG. 19 is made by adding an optical device 78 to the embodiment of FIG. 16, and FIG. 20 is a side view of the modulized semiconductor apparatus 77. Referring to FIGS. 19 and 20, the optical processing area 42 has a parabolic reflector 76 deposited in the chamber 14, and the active surface 17 of the semiconductor device 28 and the optical device 78 are located in the optical processing area 42. If the semiconductor device 28 is a solar cell or a thermoelectric semiconductor device (e.g. thermoelectric generator), radiant energy and/or light entering the container 57 through the transparent surface 21 is converged and collected by the parabolic reflector 76 on the optical device 78, and concentrated and uniformized by the optical device 78 before entering the active surface 17 for power generation. In this case, the parabolic reflector 76 acts as the collector for radiant energy and/or light so as to improve the active surface 17 of semiconductor device 28 in receiving radiant energy and/or light. The optical device 78 includes an optical lens to concentrate and evenly distribute radiant energy and/or light over the active surface 17, so as to prevent the radiant energy and/or light from focusing on a certain region of the active surface 17 and thus damaging the semiconductor device 28. If the semiconductor device 28 is an LED, the light it emits is first converged and concentrated by the optical device 78, and then further converged and concentrated by the parabolic reflector 76, before being casted from the chamber 14 through the transparent surface 21 for illumination. In this case, the parabolic reflector 76 further converges and collects the light emitted by the LED so as to improve light concentration.

Figure 21:
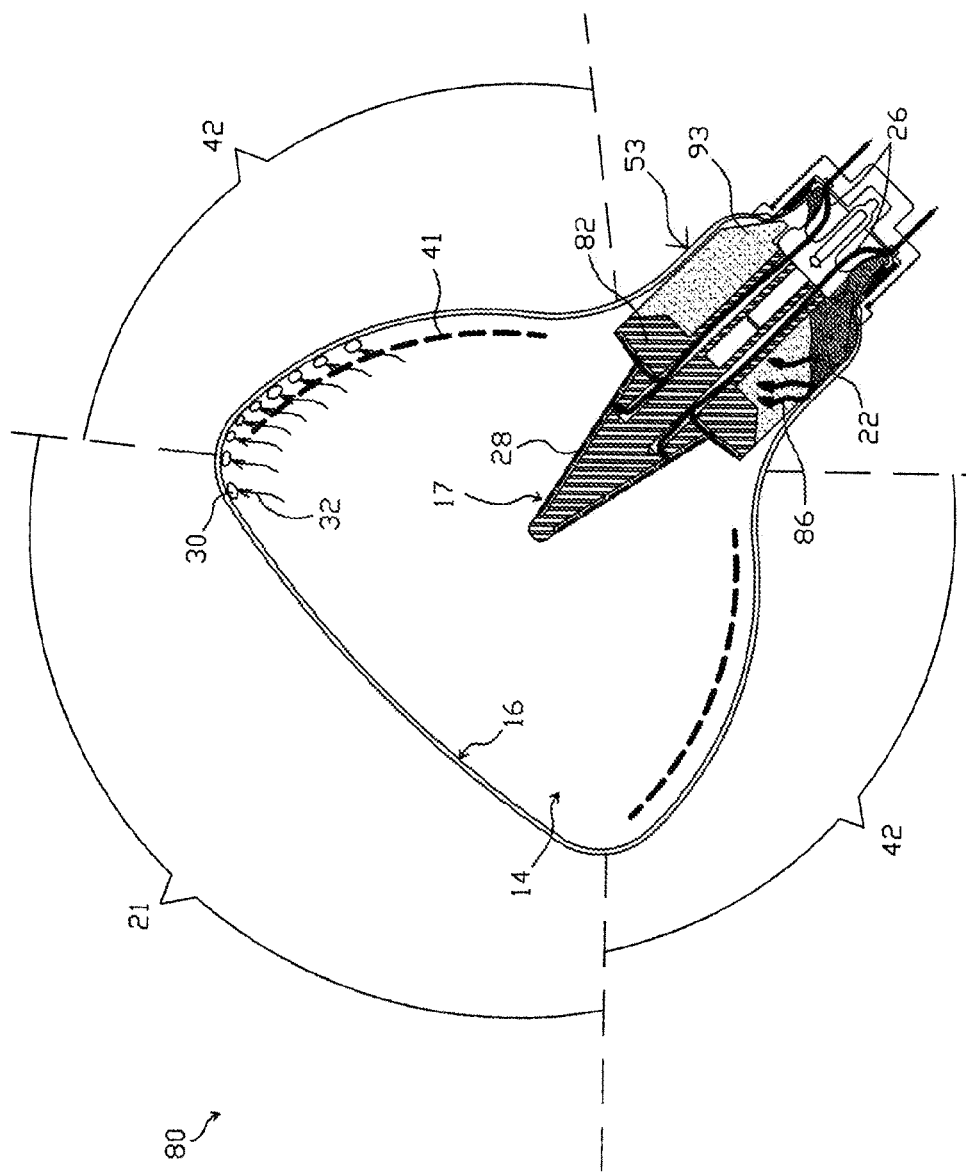
FIG. 21 is a schematic diagram showing a sixth embodiment of a modulized semiconductor apparatus according to the present invention.
Figure 22:
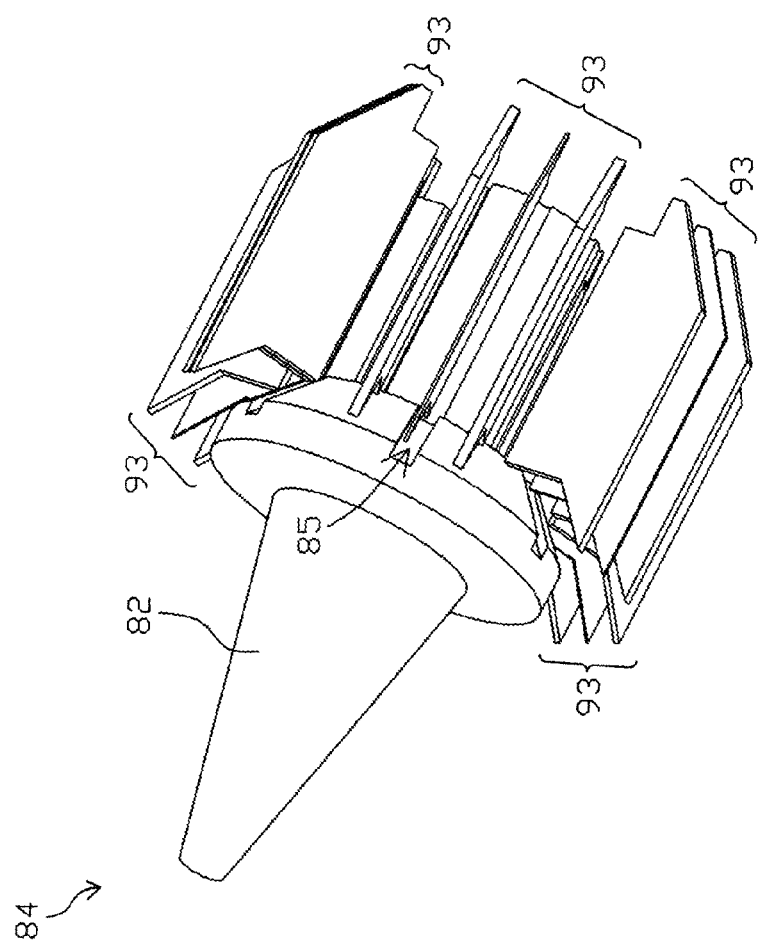
FIG. 22 is an exploded view of the evaporator shown in FIG. 21.

In the applications of collecting solar energy, as shown in FIG. 21, the transparent surface 21 of a modulized semiconductor apparatus 80 faces upward and includes a 45° included angle with the horizontal, so as to aim the transparent surface 21 at the sun. In this embodiment, the optical processing area 42 occupies a part of the chamber wall 16, which has an optical processing unit 41, such as an optically reflective layer provided on the inner or outer surface of the chamber wall 16, for converging and collecting sunlight entering the chamber 14 onto the active surface 17 of the semiconductor device 28. As shown in FIG. 22, an evaporator 84 includes a heat conductor unit 82 and thermally conductive capillary plates 93 located at the neck 53 of the container and acting as a capillary unit. The thermally conductive capillary plates 93 are inlaid into grooves 85 formed on the heat conductor unit 82 to be thermally connected to heat conductor unit 82, and have the structure as shown in FIG. 4, 5 or 6, to be thermally conductive and capable of being moistened by and conveying the liquid refrigerant 22 under capillarity. When the modulized semiconductor apparatus 80 faces upward for receiving sunlight, the liquid refrigerant 22 is gathered at the neck 53 of the container due to gravity, so that the thermally conductive capillary plates 93 can keep contacting the liquid refrigerant 22 and conveying it to the thermally conductive capillary plates 93, as indicated by arrows 86.

Since the semiconductor device 28 is small in area, for collecting sunlight onto the active surface 17 of the semiconductor device 28, it may be unavoidable that components of a sun-tracking system have to be made accurate, which requires high manufacturing costs. The modulized semiconductor apparatus 80 of FIG. 21 has the transparent surface 21 made with a relatively large area facing the sun, and the chamber wall 16 provided with the optical processing unit 41 (such as an optically reflective layer formed on the inner or outer surface of the chamber wall 16) corresponding to the optical processing area 42, the sunlight entering the chamber 14 can be converged and collected onto the active surface 17 of the semiconductor device 28, so that the requirement for preciseness of the components of a sun-tracking system can be slightly loosened, thereby saving manufacturing costs.

Figure 23:
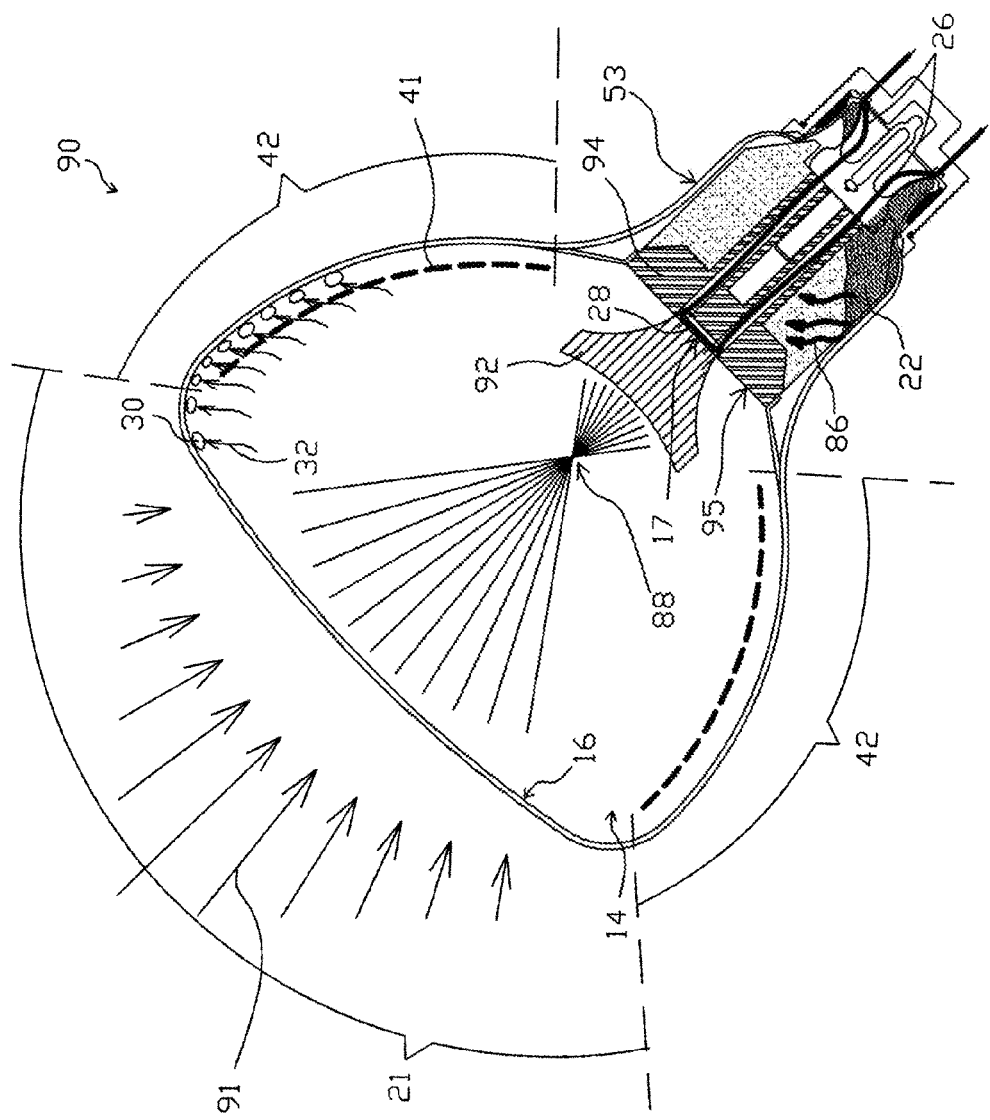
FIG. 23 is a schematic diagram showing a seventh embodiment of a modulized semiconductor apparatus according to the present invention.

FIG. 23 shows a seventh embodiment according to the present invention. In a modulized semiconductor apparatus 90, a transparent surface 21 faces upward and includes a 45° included angle with the horizontal, a heat conductor unit 94 has a plane 95 facing the transparent surface 21, a semiconductor device 28 is thermally connected to the heat conductor unit at the plane 95, and an optical device 92 is in front of the active surface 17 of the semiconductor device 28. The optical device 92 includes an optical lens to focus and evenly distribute radiant energy and/or light to the active surface 17. A primarily collected solar light 91 entering the chamber 14 through the transparent surface 21 is focused near the focal point 88, and then the optical device 92 performs secondary light collection and uniformization to guide the primarily collected solar light 91 into the active surface 17 of the semiconductor device 28. Since the optical device 92 is greater than the active surface 17 of the semiconductor device 28 in area, and the primarily collected solar light 91 coming into the chamber 14 through the transparent surface 21 has been focused near the focal point 88, even if there is some minor deviation in the optical focusing device, most of the primarily collected solar light 91 focused near the focal point 88 can be collected to the active surface 17 of the semiconductor device 28. Additionally, the chamber wall 16 has an optical processing unit 41 (such as an optically reflective layer formed on the inner or outer surface of the chamber wall 16) corresponding to the optical processing area 42, so the diffused and reflected light produced by the optical device 92 that performs concentration and uniformization on the light as the primarily collected solar light 91 being focused near the focal point 88 can be captured and processed through a third concentration before delivered to the optical device 92 and guided to the active surface 17 of the semiconductor device 28.

The modulized semiconductor apparatus 90 of FIG. 23 has a multiple light concentration design and helps to loosen requirement for preciseness of the components of a sun-tracking system, thereby saving manufacturing costs. Moreover, the optical device 92 serves to not only provide the second optical concentration, but also evenly distribute the highly concentrated primarily collected solar light 91 over the active surface 17 of the semiconductor device 28, so as to prevent the highly concentrated primarily collected solar light 91 from being focused to burn down the semiconductor device 28.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A modulized LED apparatus with enhanced heat dissipation, comprising:
a container having a chamber wall with a chamber therein, the chamber wall having a transparent surface allowing the container to be pervious to radiant energy including light, the container having an optical processing area for converging, collecting or diffusing radiant energy including light;
a liquid refrigerant in the chamber of the container;
an evaporator in the chamber, of the container, partially contacting the liquid refrigerant contained in the chamber of the container, for heat and evaporate the liquid refrigerant into a gaseous refrigerant pervading the chamber of the container and to be condensed on the chamber wall of the container away from the evaporator in order to return to the liquid refrigerant; and
an LED device having an active surface and being thermally connected to the evaporator in the chamber, the active surface being exposed outside the liquid refrigerant;
wherein the evaporator comprises:
a heat conductor unit thermally connected to the LED device; and
a capillary unit thermally connected to the heat conductor unit and in contact with the liquid refrigerant in the chamber of the container, so that the liquid refrigerant is drawn to the capillary unit under capillarity, and then gets heated and evaporated by the heat conductor unit into the gaseous refrigerant pervading the chamber of the container away from the evaporator;
wherein the capillary unit comprises a thermally conductive capillary plate having a sandwich structure composed of a thermally conductive material and a capillary material, the thermally conductive material being thermally connected to the heat conductor unit, the capillary material being close to the chamber wall.

2. The modulized LED apparatus of claim 1, wherein the optical processing area is any one of a sandblasted rough surface and a hydrofluoric acid eroded rough surface.

3. The modulized LED apparatus of claim 1, wherein the optical processing area comprises a glass material with a surface coated with a semitranslucent coating.

4. The modulized LED apparatus of claim 1, wherein the optical processing area comprises an optically reflective layer.

5. The modulized LED apparatus of claim 1, wherein the optical processing area comprises a parabolic reflector located in the chamber.

6. The modulized LED apparatus of claim 1, wherein the transparent surface comprises a glass material with a rough surface processed by hydrofluoric acid erosion or sandblasting.

7. The modulized LED apparatus of claim 1, wherein the transparent surface comprises a glass material with a surface coated with a semitranslucent coating.

8. The modulized LED apparatus of claim 1, further comprising an optical device in the chamber for focusing and evenly distributing radiant energy including light to the active surface.

9. The modulized LED apparatus of claim 8, wherein the optical device comprises an optical lens.

10. The modulized LED apparatus of claim 1, wherein the liquid refrigerant comprises water, methanol, ethanol, acetone, aqua ammonia, chlorofluorocarbons or a mixture of two or more thereof.

11. The modulized LED apparatus of claim 1, wherein the heat conductor unit comprises a heat pipe or a vapor chamber.

12. The modulized LED apparatus of claim 1, wherein the capillary material comprises a meshed article, powder or a fiber fabric capable of being moistened by and conveying the liquid refrigerant under capillarity.

13. The modulized LED apparatus of claim 1, further comprising a shield covering and shielding the LED device from the liquid and gaseous refrigerant.

14. The modulized LED apparatus with enhanced heat dissipation, comprising:
a container having a chamber wall with a chamber therein, the chamber wall having a transparent surface allowing the container to be pervious to a radiant energy including light, the container having an optical processing area for converging, collecting or diffusing the radiant energy including light;
a liquid refrigerant in the chamber of the container;
an evaporator in the chamber of the container, partially contacting the liquid refrigerant contained in the chamber of the container, for heating and evaporating the liquid refrigerant into a gaseous refrigerant to pervade the chamber of the container and to be condensed on the chamber wall of the container away from the evaporator in order to return to the liquid refrigerant; and
an LED device having an active surface and being thermally connected to the evaporator in the chamber, the active surface being exposed outside the liquid refrigerant,
wherein the evaporator comprises:
a heat conductor unit thermally connected to the LED device; and
a capillary unit thermally connected to the heat conductor unit and in contact with the liquid refrigerant in the chamber of the container, so that the liquid refrigerant is drawn to the capillary unit under capillarity, and then gets heated and evaporated by the heat conductor unit into the gaseous refrigerant pervading the chamber of the container away from the evaporator, and
wherein the capillary unit comprises:
a wick having a first portion thermally connected to the heat conductor unit and a second portion falling down to extend into the liquid refrigerant for conveying the liquid refrigerant to the first portion under capillarity; and
a thermally conductive capillary plate having a sandwich structure composed of a thermally conductive material and a capillary material, the thermally conductive material being thermally connected to the heat conductor unit, the capillary material being close to the chamber wall, so as to attract the liquid refrigerant on the chamber wall under capillarity.

15. The modulized LED apparatus of claim 14, wherein the capillary material contacts the wick.

16. The modulized LED apparatus of claim 14, wherein the wick comprises a meshed article, powder or a fiber fabric capable of being moistened by and conveying the liquid refrigerant under capillarity.

17. The modulized LED apparatus of claim 14, further comprising a weight affixed to the second portion of the wick so that the second portion of the wick remains contacting the liquid refrigerant under gravity.

* * * * *